United States Patent
Ramond

(10) Patent No.: US 8,957,726 B2
(45) Date of Patent: Feb. 17, 2015

(54) AMPLIFICATION CIRCUIT AND METHOD THEREFOR

(71) Applicant: Stephane Ramond, Quint-Fonsegrives (FR)

(72) Inventor: Stephane Ramond, Quint-Fonsegrives (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 58 days.

(21) Appl. No.: 13/644,938

(22) Filed: Oct. 4, 2012

(65) Prior Publication Data

US 2014/0097899 A1   Apr. 10, 2014

(51) Int. Cl.
*H03F 1/14*   (2006.01)
*H03F 3/72*   (2006.01)

(52) U.S. Cl.
CPC ....................................... *H03F 3/72* (2013.01)
USPC ............................................ 330/51; 330/251

(58) Field of Classification Search
USPC ................. 330/10, 51, 251, 207 A, 260, 291; 381/94.5, 120, 121
See application file for complete search history.

(56) References Cited

U.S. PATENT DOCUMENTS

| | | | |
|---|---|---|---|
| 4,458,208 A * | 7/1984 | Abe | 330/10 |
| 4,958,133 A | 9/1990 | Bazes | |
| 5,805,020 A * | 9/1998 | Danz et al. | 330/251 |
| 5,939,938 A | 8/1999 | Kalb et al. | |
| 7,224,218 B1 | 5/2007 | Jiang et al. | |
| 7,279,965 B2 | 10/2007 | Hansen et al. | |
| 7,312,654 B2 | 12/2007 | Roeckner et al. | |
| 7,791,427 B2 | 9/2010 | Kost | |
| 2007/0139103 A1 | 6/2007 | Roeckner et al. | |
| 2010/0141342 A1 | 6/2010 | Pujol et al. | |
| 2011/0116653 A1* | 5/2011 | Schuurmans | 381/94.5 |
| 2012/0068770 A1* | 3/2012 | Cellier et al. | 330/260 |

* cited by examiner

*Primary Examiner* — Khanh V Nguyen
(74) *Attorney, Agent, or Firm* — Rennie William Dover

(57) ABSTRACT

In accordance with an embodiment, an audio amplification circuit includes an input stage switchably connected to a switching network through a signal generator and a signal generator stage having a first input and a first output, the first input of the signal generator stage coupled to the first output of the input stage. An output stage is connected to the signal generator stage. In accordance with another embodiment, a method for inhibiting audible transients in an audio signal comprises providing an audio amplification circuit having at least one input and at least one output and coupling a first output to a first source of operating potential in response to one of starting or turning off the audio amplification circuit.

19 Claims, 9 Drawing Sheets

250

AMPLIFICATION CIRCUIT AND METHOD THEREFOR

BACKGROUND

The present invention relates, in general, to electronics and, more particularly, to amplification circuits and methods for amplifying signals.

In the past, the semiconductor industry used various methods and circuits to form audio amplifiers. These audio amplifiers generally received an input signal and drove a speaker in order to form sound. One example of such an audio amplifier was disclosed in U.S. Pat. No. 5,939,938 issued to Kalb et al. on Aug. 17, 1999. A drawback with these prior art amplifiers was turn-on and turn-off transients that created noise during the turn-on and turn-off times. The turn-on and turn-off transients produced noises, generally referred to as click or pop noises, which degraded the usability of the audio amplifier.

Accordingly, it would be advantageous to have an amplifier and a method for reducing the turn-on and turn-off transients. It is desirable for the amplifier and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
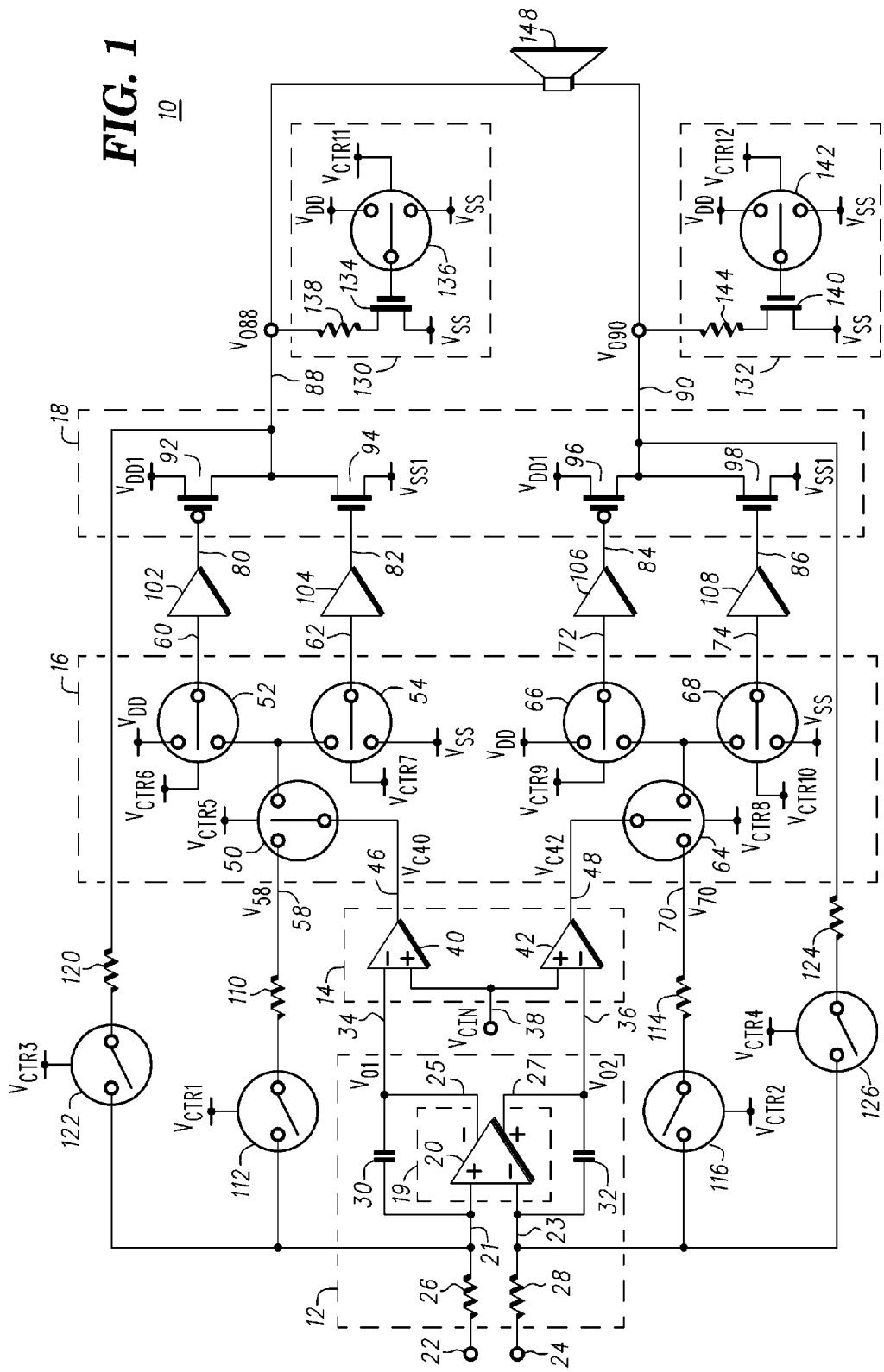
FIG. 1 is a schematic of an audio amplification circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally, the present invention provides an audio amplification circuit and a method for mitigating transients such as, for example, pop noise. In accordance with an embodiment the audio amplification circuit includes an input stage connected to a switching network through a signal generator stage, wherein the switching network includes at least one switch having a common conduction terminal coupled to a first output of the signal generator stage and a first conduction terminal switchably coupled to a first input of the input stage. The amplification circuit may further include an output stage having an input coupled to a second conduction terminal of the at least one switch.

In accordance with another embodiment, the audio amplification circuit, comprises an integrator having one or more inputs and one or more outputs. A signal generator has inputs connected to corresponding outputs of the integrator. A switching network has one or more outputs that are switchably coupled to corresponding inputs of the integrator. An output stage has one or more outputs that are switchably coupled to corresponding inputs of the integrator.

In accordance with another embodiment, a method includes inhibiting audible transients in an audio signal. An audio amplification circuit having at least one input and at least one output is provided. An output of the at least one output is coupled to a source of operating potential in response to one of starting or turning off the audio amplification circuit.

FIG. 1 is a circuit schematic of an audio amplification circuit 10 in accordance with an embodiment of the present invention. Audio amplification circuit 10 comprises an input stage 12 coupled to an output stage 18 through a signal generator stage 14 and a switching network 16. Input stage 12 includes an amplification stage 19 having inputs 21 and 23 and outputs 25 and 27. By way of example, amplification stage 19 comprises an amplifier 20 having differential inputs and differential outputs. More particularly, amplifier 20 is a differential amplifier having a noninverting input and an inverting input which serve as inputs 21 and 23, respectively, and an inverting output, and a noninverting output, which serve as outputs 25 and 27, respectively. Inputs 21, 22, 23, and 24 serve as inputs of input stage 12 and outputs 25 and 27 serve as outputs of input stage 12. The noninverting input of amplifier 20, i.e., input 21, is connected to an input terminal 22 of audio amplification circuit 10 through a resistor 26 and the inverting input of amplifier 20, i.e., input 23, is connected to an input terminal 24 through a resistor 28. The inverting output of amplifier 20, i.e., output 25, is connected to its noninverting input 21 through a capacitor 30 and the noninverting output of amplifier 20, i.e., output 27, is connected to its inverting input 23 through a capacitor 32. Amplifier 20 in combination with capacitors 30 and 32 and resistors 26 and 28 form an integrator. Accordingly, amplifier 20 is configured as an integrator. It should be noted that the circuit network formed between output 25 and input 21 and the circuit network formed between output 27 and input 23 are not limited to being a single capacitor. For example, they may be comprised of a combination of a capacitor and a resistor, or a combination of two capacitors and a resistor, or other combinations of circuit elements.

Signal generator stage 14 has an input 34 connected to inverting output 25 of amplifier 20, an input 36 connected to noninverting output 27 of amplifier 20, and an input 38 coupled for receiving a comparator input signal $V_{CIN}$. By way of example, signal generator stage 14 is comprised of comparators 40 and 42, each comparator having an inverting input, a noninverting input and an output. The inverting input of comparator 40 is connected to inverting output 25 of amplifier 20 and the inverting input of comparator 42 is connected to noninverting output 27 of amplifier 20. The noninverting inputs of comparators 40 and 42 are connected together and coupled for receiving comparator input signal $V_{CIN}$. Suitable types of signals for comparator input $V_{CIN}$ include a sawtooth signal, a square wave signal, a sinusoidal signal, a Direct Current (DC) signal, etc. By way of example, comparator input signal $V_{CIN}$ is a sawtooth signal. The outputs of comparators 40 and 42 serve as the outputs of signal generator stage 14. It should be noted that signal generator stage 14 may be referred to as a signal generator.

In accordance with an embodiment, switching network 16 is comprised of a plurality of switches and has inputs 46 and 48 and outputs 60, 62, 72, and 74, wherein inputs 46 and 48 are connected to the outputs of comparators 40 and 42, respectively. By way of example, switching network 16 is comprised of switches 50, 52, and 54, where switch 50 has a common conduction terminal that is connected to or, alternatively, serves as input 46, a conduction terminal that is connected to or, alternatively, serves as an output 58, a conduction terminal that is commonly connected to conduction terminals of switches 52 and 54, and a control terminal coupled for receiving a control signal $V_{CTR5}$. Switch 52 has a common conduction terminal that is connected to or, alternatively, serves as an output 60, a conduction terminal coupled for receiving a source of operating potential such as, for example, operating potential $V_{DD}$, and a control terminal coupled for receiving a control signal $V_{CTR6}$. Switch 54 has a common conduction terminal that is connected to or, alternatively, serves as an output 62, a conduction terminal coupled for receiving a source of operating potential such as, for example, an operating potential $V_{SS}$, and a control terminal coupled for receiving a control signal $V_{CTR7}$. By way of example, $V_{SS}$ is ground potential and $V_{DD}$ is 3 volts. It should be noted that the values of operating potentials $V_{SS}$ and $V_{DD}$ are not limitations of the present invention. Switches 50, 52, and 54 may be single pole double throw switches, double pole, double throw switches, etc. Switches 50, 52, and 54 may be implemented using transistors. Alternatively, switches 50, 52, and 54 may be digital cells implemented using inductors, NAND gates, AND gates, etc. or they can be analog or digital switches.

Switching network 16 is further comprised of switches 64, 66, and 68, where switch 64 has a common conduction terminal that is connected to or, alternatively, serves as input 48, a conduction terminal that is connected to or, alternatively, serves as an output 70, a conduction terminal that is commonly connected to the conduction terminals of switches 66 and 68, and a control terminal coupled for receiving a control signal $V_{CTR8}$. Switch 66 has a common conduction terminal that is connected to or, alternatively, serves as an output 72, a conduction terminal coupled for receiving a source of operating potential such as, for example, supply potential $V_{DD}$, and a control terminal coupled for receiving a control signal $V_{CTR9}$. Switch 68 has a common conduction terminal that is connected to or, alternatively, serves as an output 74, a conduction terminal coupled for receiving a source of operating potential such as, for example, supply potential $V_{SS}$, and a control terminal coupled for receiving a control signal $V_{CTR10}$. Like switches 50, 52, and 54, switches 64, 66, and 68 may be single pole double throw switches, double pole, double throw switches, etc. Switches 64, 66, and 68 may be implemented using transistors. Alternatively, switches 64, 66, and 68 may be digital cells implemented using inductors, NAND gates, AND gates, etc. or they can be analog or digital switches.

Although switching network 16 is shown as a single structure, it may be comprised of two switching sections where each switching section comprises a plurality of switches. For example, one switching section may be comprised switches 50, 52, and 54 and another switching section may be comprised of switches 64, 66, and 68.

Output stage 18 has input terminals 80, 82, 84, and 86, output terminals 88 and 90, and is comprised of a plurality of transistors wherein each transistor has a control electrode and a pair of current carrying electrodes. As discussed above, for a field effect transistor the gate electrode serves as the control electrode and the source and drain electrodes serve as current carrying electrodes. In accordance with an embodiment, output stage 18 is comprised of transistors 92, 94, 96, and 98. By way of example, transistors 92 and 96 are p-channel transistors and transistors 94 and 98 are n-channel transistors. Transistor 92 has a gate electrode that may be connected to or, alternatively, serves as input 80, a source electrode coupled for receiving a source of operating potential $V_{DD1}$, and a drain electrode connected to a drain electrode of n-channel transistor 94. In addition, transistor 94 has a gate electrode that may be connected to or, alternatively, serves as input 82 and a source electrode coupled for receiving a source of operating potential $V_{SS1}$. Transistor 96 has a gate electrode that may be connected to or, alternatively, serves as input 84, a source electrode coupled for receiving a source of operating potential $V_{DD1}$, and a drain electrode connected to a drain electrode of re-channel transistor 98. In addition, transistor 98 has a gate electrode that may be connected to or, alternatively, serves as input 86 and a source electrode coupled for receiving a source of operating potential $V_{SS1}$. Operating potential $V_{SS1}$ may range from about 0 volts to about −60 volts (negative sixty volts) and operating potential $V_{DD1}$ may range from about 0 volts to about +60 volts (positive sixty volts).

Input terminals 80, 82, 84, and 86 are connected to outputs 60, 62, 72, and 74 through driver circuits 102, 104, 106, and 108, respectively. Driver circuits 102, 104, 106, and 108 may be referred to as buffer circuits, drivers, or buffers. Accordingly, the conduction terminal of switch 52 is coupled to the gate or control electrode of transistor 92 through driver circuit 102; the conduction terminal of switch 54 is coupled to the gate or control electrode of transistor 94 through driver circuit 104; the conduction terminal of switch 66 is coupled to the gate or control electrode of transistor 96 through driver circuit 106; and the conduction terminal of switch 68 is coupled to the gate or control electrode of transistor 98 through driver circuit 108. Driver circuits 102, 104, 106, and 108 are optional that may be absent or alternatively, they may form part of output stage 18.

It should be noted that the type of transistor for transistors 92-98 is not a limitation. The transistors can be Bipolar Transistors, Metal Oxide Semiconductor Field Effect Transistors, Junction Field Effect Transistors, or the like. In addition, transistors 92 and 96 are not limited to being p-channel transistors and transistors 94 and 98 are not limited to being n-channel transistors. Like switching network 16, output stage 18 is shown as a single structure, however it may be comprised of two output sections where each output section comprises one or more output transistors or four output sections each comprising a single transistor, or the like. For example, one output section may be comprised transistors 92 and 94 and another output section may be comprised of transistors 96 and 98.

Output 58 of switch 50 is switchably or temporarily coupled to the noninverting input of amplifier 20 through a series connected impedance 110 and switch 112, wherein a terminal of impedance 110 is connected to output 58 and the other terminal of impedance 110 is connected to a conduction terminal of switch 112. It should be noted that impedance 110 is switchably coupled between output 58 of switching network 16 and input 23 of input stage 12. By way of example, impedance 110 is a resistor. The other conduction terminal of switch 112 is connected to the noninverting input of amplifier 20 and a control terminal of switch 112 is coupled for receiving a control signal $V_{CTR1}$. Switch 112 may be referred to as a feedback control switch. Switch 112 may be implemented as a transistor wherein the control electrode of the transistor serves as the control terminal of the switch and the current carrying electrodes of the transistor serve as the conduction terminals of the switch.

Output 70 of switch 64 is switchably or temporarily coupled to the inverting input of amplifier 20 through a series connected impedance 114 and switch 116, wherein a terminal of impedance 114 is connected to output 70 and the other terminal of impedance 114 is connected to a conduction terminal of switch 116. It should be noted that impedance 114 is switchably coupled between output 70 of switching network 16 and input 23 of input stage 12. By way of example, impedance 114 is a resistor. The other conduction terminal of switch 116 is connected to the inverting input of amplifier 20 and a control terminal of switch 116 is coupled for receiving a control signal $V_{CTR2}$. Switch 116 may be referred to as a feedback control switch. It should be noted that control signals $V_{CTR1}$ and $V_{CTR2}$ may be the same signal or they may be different signals from each other. Switch 116 may be implemented as a transistor wherein the control electrode of the transistor serves as the control terminal of the switch and the current carrying electrodes of the transistor serve as the conduction terminals of the switch.

Output 88 of output stage 18 is switchably coupled to the noninverting input of amplifier 20 through a series connected impedance 120 and switch 122, wherein a terminal of impedance 120 is connected to output 88 and the other terminal of impedance 120 is connected to a conduction terminal of switch 122. It should be noted that impedance 120 is switchably coupled between output 88 of output stage 18 and input 21 of input stage 12 and may be referred to as a feedback impedance. By way of example, impedance 120 is a resistor. The other conduction terminal of switch 122 is connected to the noninverting input of amplifier 20 and a control terminal of switch 122 is coupled for receiving a control signal $V_{CTR3}$. Switch 122 may be implemented as a transistor wherein the control electrode of the transistor serves as the control terminal of the switch and the current carrying electrodes of the transistor serve as the conduction terminals of the switch.

Output 90 of output stage 18 is switchably coupled to the inverting input of amplifier 20 through a series connected impedance 124 and switch 126, wherein a terminal of impedance 124 is connected to output 90 and the other terminal of impedance 124 is connected to a conduction terminal of switch 126. It should be noted that impedance 124 is switchably coupled between output 90 of output stage 18 and input 23 of input stage 12 and may be referred to as a feedback impedance. By way of example, impedance 124 is a resistor. The other conduction terminal of switch 126 is connected to the inverting input of amplifier 20 and a control terminal of switch 126 is coupled for receiving a control signal $V_{CTR4}$. It should be noted that control signals $V_{CTR3}$ and $V_{CTR4}$ may be the same signal or they may be different signals from each other. Switch 126 may be implemented as a transistor wherein the control electrode of the transistor serves as the control terminal of the switch and the current carrying electrodes of the transistor serve as the conduction terminals of the switch.

An active pull down stage 130 may be connected to output 88 of output stage 18 and an active pull down stage 132 may be connected to output 90 of output stage 18. Active pull down stage 130 may be comprised of an n-channel transistor 134 having a gate electrode connected to a switch 136, a drain electrode connected to output 88 through an impedance element 138, and a source electrode coupled for receiving a source of operating potential such as, for example, operating potential $V_{SS}$. By way of example, impedance element 138 is a resistor. It should be noted that resistor 138 is optional and may be absent from active pull down stage 130. Switch 136 has a common electrode connected to the gate electrode of transistor 134, a conduction electrode coupled for receiving a source of operating potential $V_{DD}$, a conduction electrode coupled for receiving a source of operating potential $V_{SS}$, and a control electrode coupled for receiving a control signal $V_{CTR11}$. Switch 136 may be implemented as a transistor wherein the control electrode of the transistor serves as the control terminal of the switch and the current carrying electrodes of the transistor serve as the conduction terminals of the switch.

Active pull down stage 132 may be comprised of an n-channel transistor 140 having a gate electrode connected to a switch 142, a drain electrode connected to output 90 through an impedance element 144, and a source electrode coupled for receiving a source of operating potential $V_{SS}$. By way of example, impedance element 144 is a resistor. It should be noted that resistor 144 is optional and may be absent from active pull down stage 132. Switch 142 has a common electrode connected to the gate electrode of transistor 140, a conduction electrode coupled for receiving a source of operating potential $V_{DD}$, a conduction electrode coupled for receiving a source of operating potential $V_{SS}$, and a control electrode coupled for receiving a control signal $V_{CTR12}$. Switch 142 may be implemented as a transistor wherein the control electrode of the transistor serves as the control terminal of the switch and the current carrying electrodes of the transistor serve as the conduction terminals of the switch.

In accordance with an embodiment audio amplification circuit 10 drives a load 148, which may be, for example, a speaker having a terminal connected to output 88 and a terminal connected to output 90.

Figure 2:
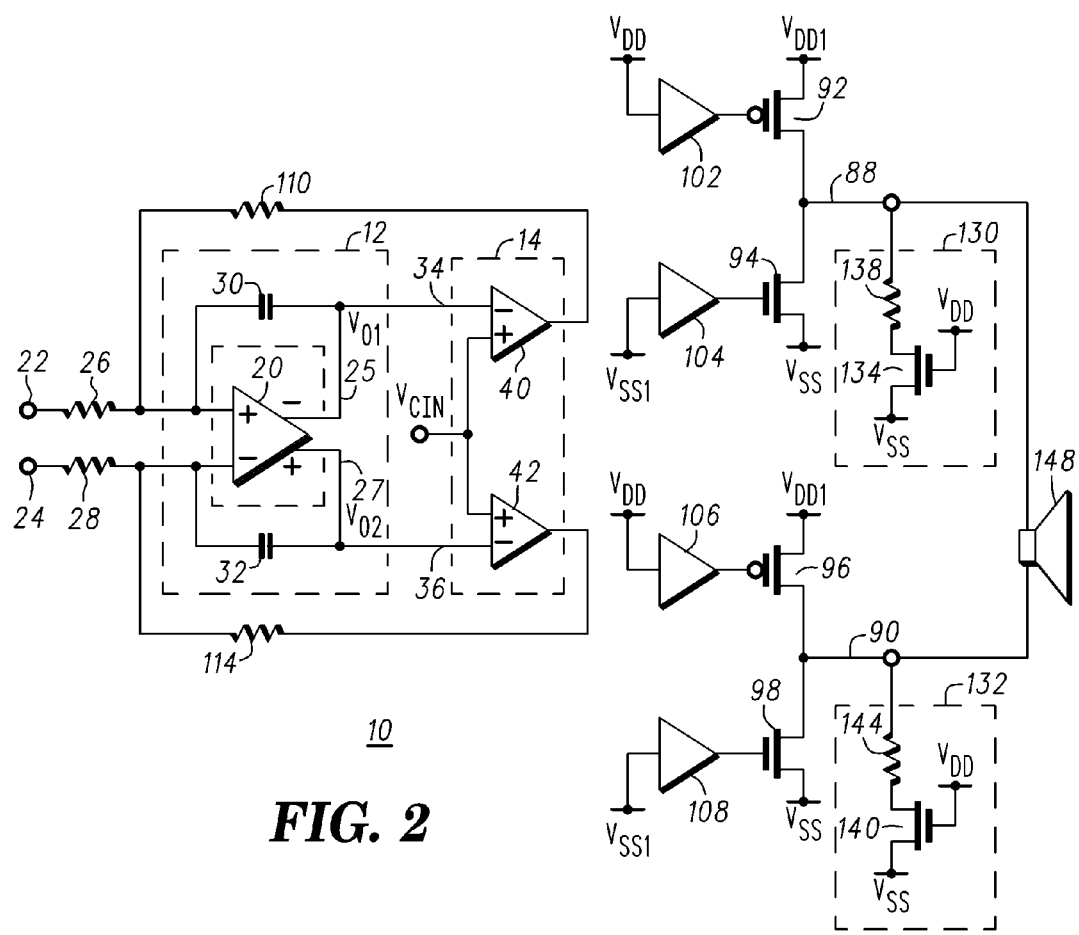
FIG. 2 is a schematic of the audio amplification circuit of FIG. 1 in accordance with an embodiment of the present invention, wherein switches of the audio amplification circuit are in a first configuration.

Briefly referring to FIG. 2, audio amplification circuit 10 is shown as being configured in an "off" operating mode. In the configuration shown in FIG. 2, outputs 88 and 90 are substantially tied to operating potential $V_{SS1}$, the output of comparator 40 is connected to the noninverting input of amplifier 20 through resistor 110 and switch 112 (not shown because it is closed), and the output of comparator 42 is connected to the inverting input of amplifier 20 through resistor 114 and switch 116 (not shown because it is closed), allowing a desired biasing of audio amplification circuit 10. Connecting outputs 88 and 90 to operating potential $V_{SS1}$ precludes transients from being transmitted to speaker 148. In accordance with embodiments in which operating potential $V_{SS1}$ is ground, outputs 88 and 90 are substantially tied to ground. In response to outputs 88 and 90 being tied to ground, transistors 92, 94, 96, and 98 are off or in an off mode, substantially zero current flows through resistor 138 and transistor 134 and through resistor 144 and transistor 140, and the voltage across the combination of resistor 138 and transistor 134 and across the combination of resistor 144 and transistor 140 is substantially zero.

Figure 3:
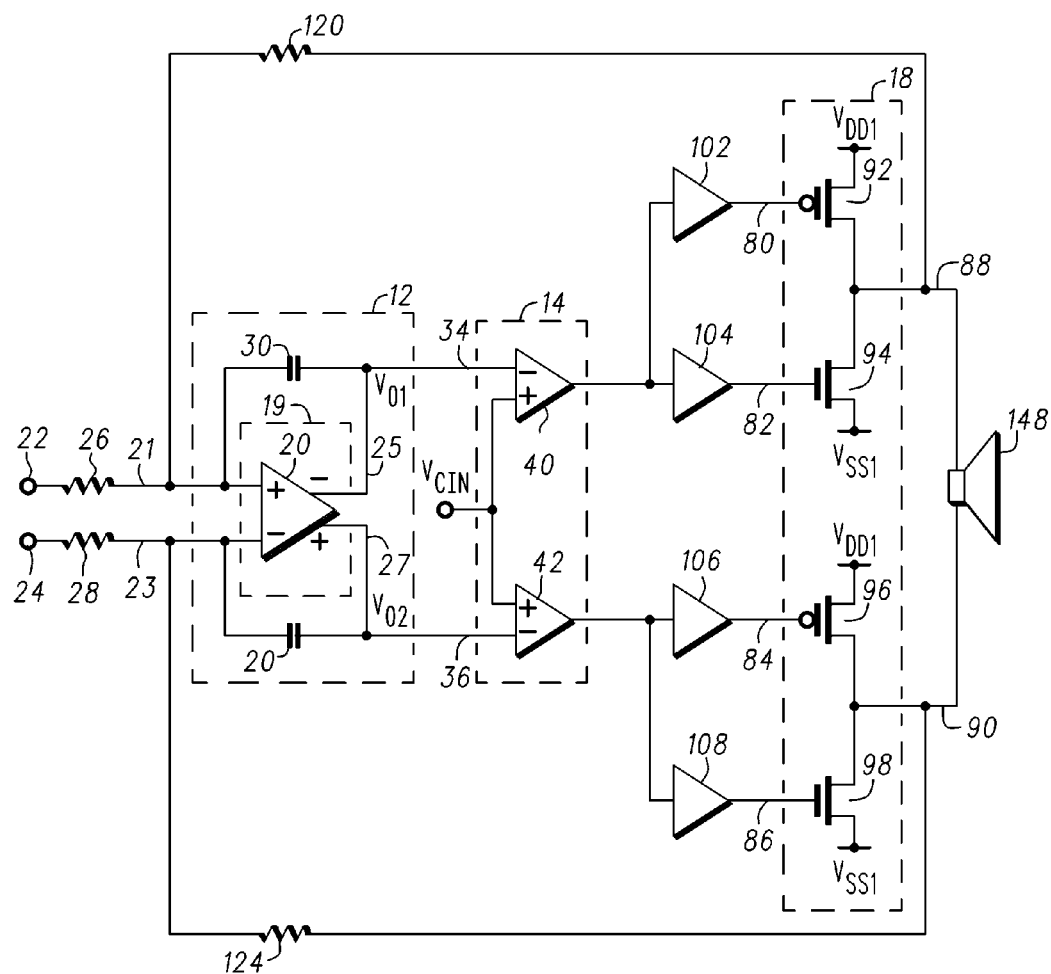
FIG. 3 is a schematic of the audio amplification circuit of FIG. 1 in accordance with an embodiment of the present invention, wherein switches of the audio amplification circuit are in a second configuration.

FIG. 3 illustrates, audio amplification circuit 10 configured in an "on" operating mode. In the configuration shown in FIG. 3, outputs 88 and 90 are connected to load 148. Output 88 is also connected noninverting input 21 through resistor 120 and switch 122 (not shown in FIG. 3 because it is closed) and output 90 is also connected to inverting input 23 through resistor 124 and switch 126 (not shown in FIG. 3 because it is closed).

Figure 4:
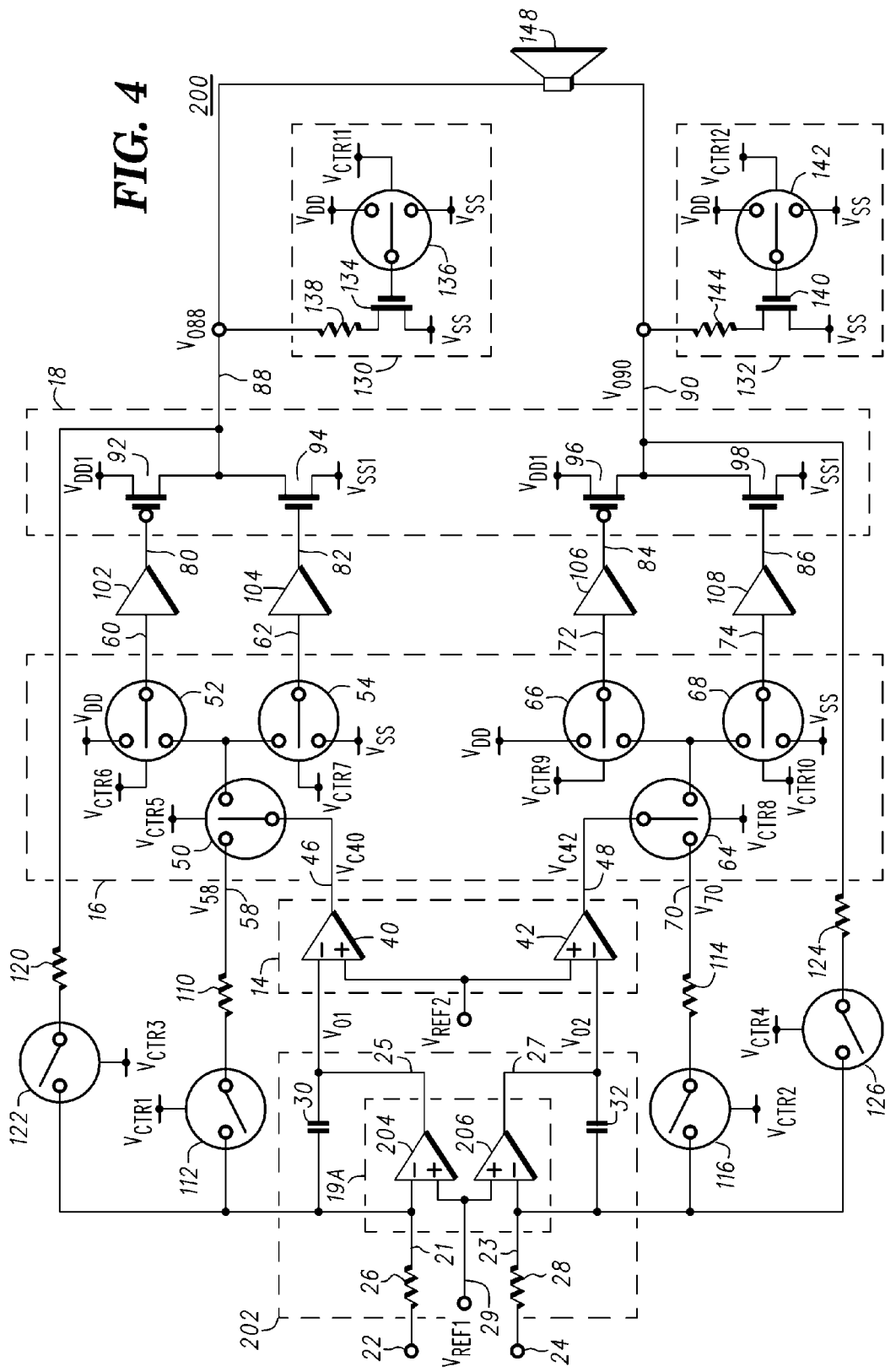
FIG. 4 is a schematic of an audio amplification circuit in accordance with another embodiment of the present invention.

FIG. 4 is a circuit schematic of an audio amplification circuit 200 in accordance with another embodiment of the present invention. Audio amplification circuit 200 includes input terminals 22 and 24, signal generator stage 14, switching network 16, output stage 18, capacitors 30 and 32, active pull down stages 130 and 132, switches 112, 116, 122, and 126, and resistors 26, 28, 110, 114, 120, and 124 described with reference to FIG. 1. Audio amplification circuit 200 further includes an input stage 202 having an amplification stage 19A comprised of operational amplifiers 204 and 206. In addition to operational amplifiers 204 and 206, amplification stage 19A has inputs 21, 23, and 29 and outputs 25 and 27. Reference character "A" has been appended to reference character "19" to distinguish the amplification stages of audio amplification circuits 10 and 200 from each other. Operational amplifiers 204 and 206 each have an inverting input, a noninverting input, and an output, wherein the inverting inputs of operational amplifiers 204 and 206 serve as inputs 21 and 23, respectively, of amplification stage 19A. In addition, the noninverting inputs of operational amplifiers 204 and 206 are commonly connected together to form input 29 of amplifier stage 19A. The inverting input of amplifier 204 is connected to input terminal 22 of audio amplification circuit 200 through resistor 26, the noninverting input of amplifier 204 is connected to the noninverting input of amplifier 206, and the inverting input of amplifier 206 is connected to input terminal 24 through resistor 28. The commonly connected noninverting inputs of amplifiers 204 and 206 are coupled for receiving a reference signal $V_{REF1}$. The output of amplifier 204 is connected to its inverting input through capacitor 30 and the output of amplifier 206 is connected to its inverting input through capacitor 32. Operational amplifier 204 in combination with capacitor 30 and resistor 26 form an integrator and operational amplifier 206 in combination with capacitor 32 and resistor 28 form an integrator. Accordingly, amplifiers 204 and 206 are configured as integrators.

It should be noted that the "on" and "off" switching configurations for switches 50, 52, 54, 64, 66, 68, 112, 116, 122, 126, 136, and 142 of audio amplification circuit 10 illustrated and described with reference to FIGS. 2 and 3 applies to the "on" and "off" switching configurations for switches 50, 52, 54, 64, 66, 68, 112, 116, 122, 126, 136, and 142 of audio amplification circuit 200.

Figure 5:
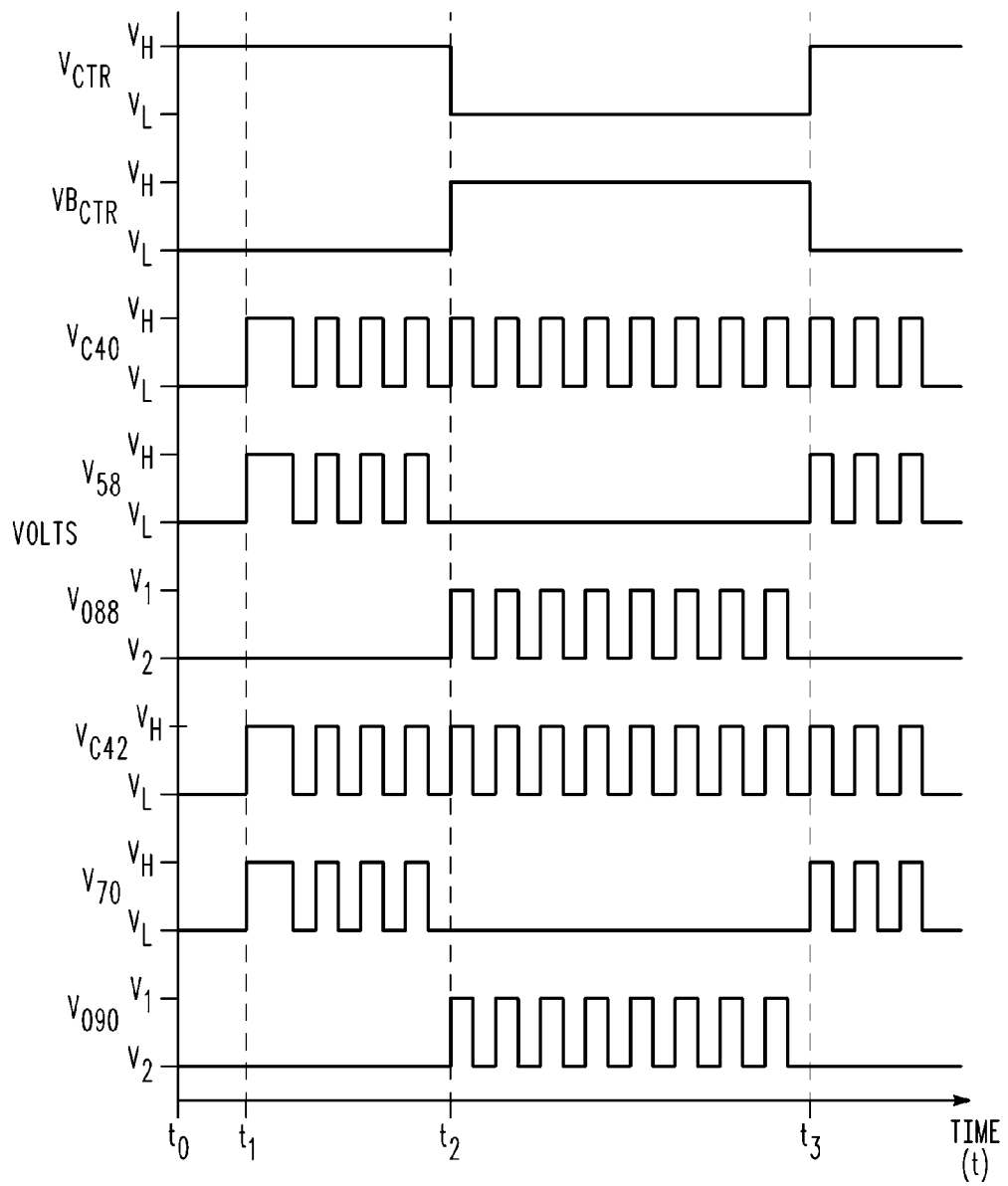
FIG. 5 is a timing diagram suitable for use with the audio amplification circuit of FIG. 1.

FIG. 5 is a timing diagram 250 of control signals appearing at the control terminals of switches 50, 52, 54, 64, 66, 68, 112, 116, 122, 126, 136, and 142 illustrated in FIGS. 1 and 4. FIG. 5 also illustrates the output signals of signal generator stage 14 and output stage 18, and temporary feedback signals $V_{58}$ and $V_{70}$ appearing at outputs 58 and 70, respectively. For the sake of universality, control signals $V_{CTR1}$, $V_{CTR2}$, $V_{CTR3}$, $V_{CTR4}$, $V_{CTR5}$, $V_{CTR6}$, $V_{CTR7}$, $V_{CTR8}$, $V_{CTR9}$, $V_{CTR10}$, $V_{CTR11}$, and $V_{CTR12}$ are shown in FIGS. 1 and 4 as being separate signals. However, in accordance with an embodiment, signals $V_{CTR1}$, $V_{CTR2}$, $V_{CTR5}$, $V_{CTR6}$, $V_{CTR7}$, $V_{CTR8}$, $V_{CTR9}$, $V_{CTR10}$, $V_{CTR11}$, and $V_{CTR12}$ are the same signals and signals $V_{CTR3}$ and $V_{CTR4}$, are complementary signals to signals $V_{CTR1}$, $V_{CTR2}$, $V_{CTR5}$, $V_{CTR6}$, $V_{CTR7}$, $V_{CTR8}$, $V_{CTR9}$, $V_{CTR10}$, $V_{CTR11}$, and $V_{CTR12}$. Accordingly, timing diagram 250 shown in FIG. 5 labels signals $V_{CTR1}$, $V_{CTR2}$, $V_{CTR5}$, $V_{CTR6}$, $V_{CTR7}$, $V_{CTR8}$, $V_{CTR9}$, $V_{CTR10}$, $V_{CTR11}$, and $V_{CTR12}$ as control signal $V_{CTR}$ and signals $V_{CTR3}$ and $V_{CTR4}$ as control signal $VB_{CTR}$. Signals $V_{CTR}$ and $VB_{CTR}$ may be referred to as enable and disable signals respectively. In operation, before time $t_0$ the system that includes audio amplification circuit 10 is off. In response to an enable signal at time $t_0$, audio amplification circuit 10 turns on and enters an idle mode where amplifier 20 is on but its outputs are substantially grounded in embodiments in which operating voltage $V_{SS1}$ is at ground potential. In the idle mode, the voltage levels of control signals $V_{CTR}$ and $VB_{CTR}$ are such that switches 112 and 116 are closed and switches 122 and 126 are open. By way of example, control signal $V_{CTR}$ is at a logic high voltage level and control signal $VB_{CTR}$ is at a logic low voltage level. Output 58 of switching network 16 is connected to the noninverting input of amplifier 20, output 70 of switching network 16 is connected to the inverting input of amplifier 20, and outputs 88 and 90 of output stage 18 are electrically disconnected from the noninverting input and the inverting input of amplifier 20, respectively. In addition, switch 50 is configured such that output 58 of switching network 16 is electrically connected to the output of comparator 40 and switch 64 is configured such that output 70 of switching network 16 is electrically connected to the output of comparator 42.

Switches 52, 66, 136, and 142 are configured such that their common conduction terminals are coupled for receiving source of operating potential $V_{DD}$, and the common conduction terminals of switches 54 and 68 are coupled for receiving source of operating potential $V_{SS}$. As discussed with reference to FIG. 3, outputs 88 and 90 are substantially tied to voltage $V_{SS}$ (which is at ground potential in embodiments in which voltage $V_{SS}$ is at ground potential), the output of comparator 40 is connected to the noninverting input of amplifier 20, and the output of comparator 42 is connected to the inverting input of amplifier 20, allowing a desired biasing of audio amplification circuit 10. Accordingly, outputs 88 and 90 are tied to voltage $V_{SS1}$, precluding transients from being transmitted to speaker 148. As mentioned above, timing diagram 150 applies to audio amplification circuits 10 and 200.

In response to comparator input signal $V_{CIN}$ at the noninverting inputs of comparators 40 and 42 and output signals $V_{O1}$ and $V_{O2}$ of integrator circuit 19 at inputs 34 and 36 of comparators 40 and 42, respectively, at time $t_1$, comparator 40 generates an output signal $V_{C40}$ and comparator 42 generates an output signal $V_{C42}$ that are input to the common conduction terminals of switches 50 and 64, respectively. Because switch 50 is configured such that its common conduction terminal is electrically connected to output 58 and electrically disconnected from inputs 60 and 62, output signal $V_{C40}$ is transmitted to noninverting input 21 of operational amplifier 20 through resistor 110 and switch 112 and output signal $V_{O88}$ is connected to potential $V_{SS1}$, which may be at ground potential. Likewise, because switch 64 is configured such that its common conduction terminal is electrically connected to output 70 and electrically disconnected from inputs 72 and 74, output signal $V_{C42}$ is transmitted to inverting input 23 of operational amplifier 20 through resistor 114 and switch 116 and output signal $V_{O90}$ is connected to potential $V_{SS1}$, which may be at ground potential. Thus, outputs 88 and 90 are connected to source of operating potential $V_{SS1}$ in response to starting or tuning on audio amplification circuit 10.

Opening switch 122 and closing switch 112 disables or deactivates a feedback path from output stage 18 to input stage 12 through resistor 120 and switch 122 and enables or activates a feedback path from switching network 16 to input stage 12 through resistor 110 and switch 112. The node at output 58 is connected to input 21. In addition, output 88 is connected to operating potential $V_{SS1}$, inhibiting or mitigating audible transients in an audio signal. Likewise, opening switch 126 and closing switch 116 disables or deactivates a feedback path from output stage 18 to input stage 12 through resistor 124 and switch 126 and enables or activates a feedback path from switching network 16 to input stage 12 through resistor 114 and switch 116. The node at output 70 is connected to input 23.

In addition, output 90 is connected to operating potential $V_{SS1}$, inhibiting or mitigating audible transients in an audio signal. It should be noted that enabling the feedback path from switching network 16 to the input stage configures switches 50 and 64 such their common conduction terminals are connected to inputs 21 and 23, respectively. Disabling the feedback path from output stage 18 to input stage 12 configures switches 50 and 64 such that their common conduction terminals are disconnected from inputs 21 and 23. In accordance with embodiments, between times $t_0$ and $t_1$ the voltages at nodes $V_{58}$, $VO_{88}$, $V_{70}$, and $VO_{90}$ do not toggle. Thus, between time $t_1$ and $t_2$ output signal $V_{C40}$ is connected to output 58, i.e., output voltage $V_{58}$ is substantially equal to output voltage $V_{C40}$ and output signal $V_{O88}$ remains at a logic low voltage level. Similarly, output voltage $V_{C42}$ is connected to output 70, i.e., output voltage $V_{70}$ is substantially equal to output voltage $V_{C42}$ and output signal $V_{O90}$ remains at a logic low voltage level.

At time $t_2$, control signal $V_{CTR}$ transitions to a logic low voltage level and control signal $VB_{CTR}$ transitions to a logic high voltage level, which closes switches 122 and 126 and opens switches 112 and 116 ending the turn on sequence, and audio amplification circuit 10 enters the normal operating mode. Voltages $V_{O88}$ and $V_{O90}$ at outputs 88 and 90, respectively, begin to oscillate between voltage levels $V_1$ and $V_2$. By way of example, voltage $V_1$ is about +60 volts and voltage $V_2$ is about −60 volts. Control signal $V_{CTR}$ being at a logic low voltage level configures switch 50 such that output 58 of switching network 16 is disconnected from the noninverting input of amplifier 20 and switches 50, 52, and 54 are configured such that their common conduction terminals are connected together, which connects the output of comparator 40 to the gate electrodes of transistors 92 and 94 through drivers 102 and 104, respectively. Switch 50 is configured to route signal $V_{C40}$ to drivers 102 and 104 and feedback signal $V_{58}$ becomes substantially zero. Switch 64 is configured such that output 70 of switching network 16 is disconnected from the inverting input of amplifier 20 and switches 64, 66, and 68 are configured such that their common conduction terminals are connected together, which connects the output of comparator 42 to the gate electrodes of transistors 96 and 98 through drivers 106 and 108, respectively. Thus, feedback signal $V_{70}$ becomes substantially zero. Outputs 88 and 90 of output stage 18 are electrically connected to the noninverting input and the inverting input of amplifier 20 through resistors 120 and 124, respectively. In accordance with an embodiment, between times $t_2$ and $t_3$ output voltage $V_{C40}$ is connected to output 88, i.e., output voltage $V_{O88}$ is substantially equal to output voltage $V_{C40}$ and output signal $V_{58}$ remains at a logic low voltage level. Similarly, output voltage $V_{C42}$ is connected to output 90, i.e., output voltage $V_{O90}$ is substantially equal to output voltage $V_{C42}$ and output signal $V_{70}$ remains at a logic low voltage level.

In the normal operating mode, output signals $V_{C40}$ and $V_{C42}$ may be square waves, output signals $V_{O88}$ and $V_{O90}$ may be square waves, and output signals $V_{O58}$ and $V_{O70}$ are at a logic low voltage level. Alternatively, in response to operating in the normal mode, voltages $V_{O58}$ and $V_{O70}$ may float to a floating potential.

At time $t_3$, control signal $V_{CTR}$ transitions to a logic high voltage level, closing switches 112 and 116, and control signal $VB_{CTR}$ transitions to a logic low voltage level, opening switches 122 and 126, which begins the turn off sequence of audio amplification circuit 10. In addition, control signal $V_{CTR}$, being at a logic high voltage level, configures switch 50 such that the common conduction terminal of switch 50 is connected to output 58 of switching network 16. Thus, the voltage which appears at output 58 is connected to the noninverting input of amplifier 20. Switches 52 and 54 are configured such that their common conduction terminals are coupled for receiving sources of operating potential $V_{DD}$ and $V_{SS}$, respectively. Because switch 50 is configured such that its common conduction terminal is electrically connected to output 58 and electrically disconnected from inputs 60 and 62, output signal $V_{C40}$ is transmitted via output 58 to the noninverting input of operational amplifier 20 through resistor 110 and switch 112 and output signal $V_{O88}$ is connected to potential $V_{SS1}$, which may be at ground potential. Likewise, because switch 64 is configured such that its common conduction terminal is electrically connected to output 70 and electrically disconnected from inputs 72 and 74, output signal $V_{C42}$ is transmitted via output 70 to the inverting input of operational amplifier 20 through resistor 114 and switch 116 and output signal $V_{O90}$ is connected to potential $V_{SS1}$, which may be at ground potential. Circuit 10 enters an idle operating mode. It should be noted that output voltages $V_{58}$, $V_{O88}$, $V_{70}$, and $V_{O90}$ have the same phase, i.e., are in phase, throughout the timing sequence.

Figure 6:
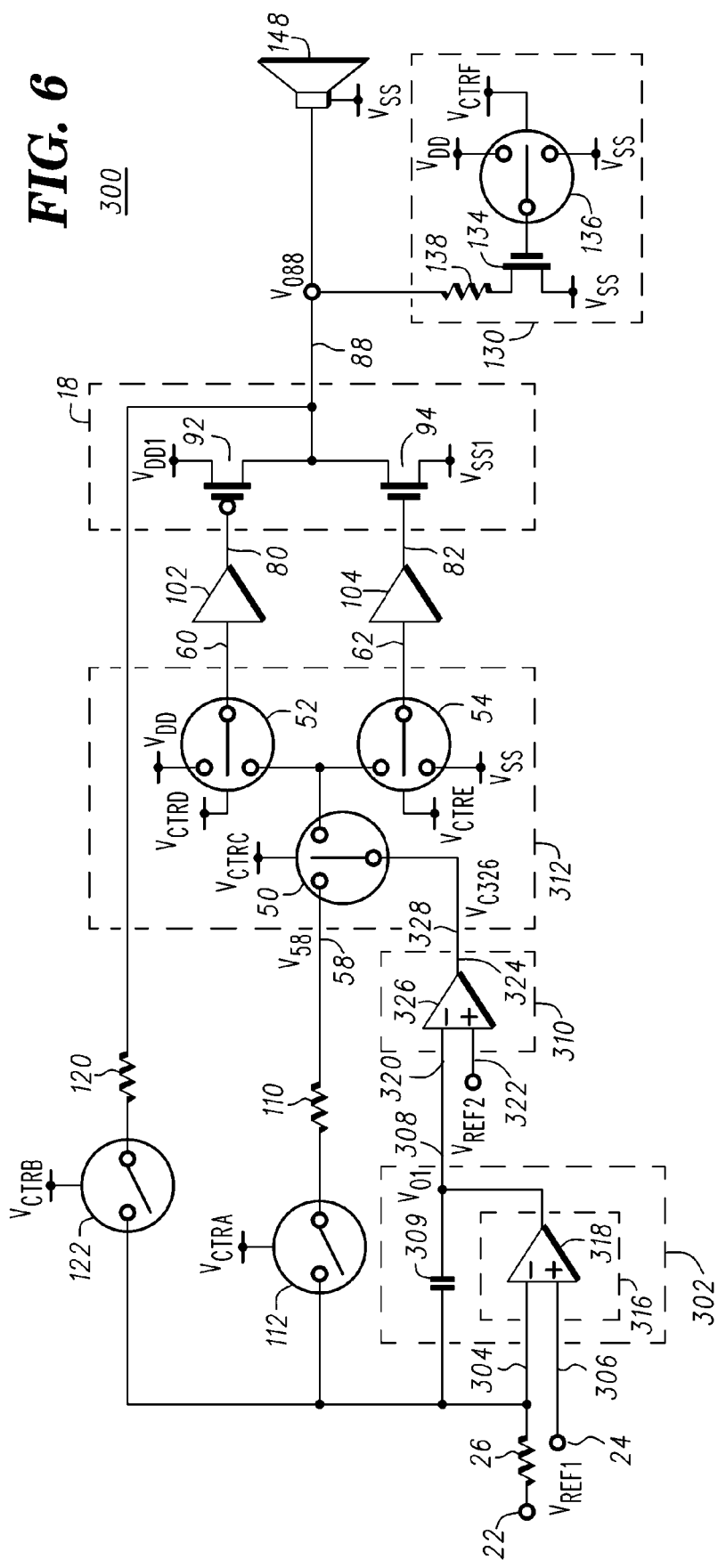
FIG. 6 is a schematic of an audio amplification circuit in accordance with another embodiment of the present invention.

FIG. 6 is a circuit schematic of an audio amplification circuit 300 in accordance with another embodiment of the present invention. Audio amplification circuit 300 includes an input stage 302 having inputs 304 and 306 and an output 308, a signal generator stage 310, a switching network 312, and an active pull down stage 130. In addition, audio amplification circuit 300 includes resistor 110 and switch 112 which provide a temporary feedback path and resistor 120 and switch 122 which provide a nominal feedback path. Output stage 18 and active pull down stage 130 have been described with reference to FIG. 1. Although transistors 96 and 98 are not included in output stage 18 shown in FIG. 6, the reference character 18 has been preserved to identify the output stage. Switches 50, 52, and 54 of switching network 312 have been described with reference to FIG. 1.

Audio amplification circuit 300 differs from audio amplification circuit 10 in that input stage 302 includes an amplification stage 316 that is comprised of an operational amplifier 318 having an inverting input, a noninverting input, and an output, and a feedback element 309, where the inverting input is connected to or, alternatively, serves as input 304, the noninverting input is connected to or, alternatively, serves as input 306, and the output is connected to or, alternatively, serves as output 308. By way of example, feedback element 309 is a capacitor. Capacitor 309 is connected from output 308 to input 304. Although feedback element 309 is shown as a capacitor, this is not a limitation of the present invention. Feedback element 309 can be comprised of one or more capacitors, one or more resistors, or the like to configure input stage 302 as an integrator. Signal generator stage 310 has inputs 320 and 322, an output 324, and is comprised of a comparator 326 having an inverting input which is connected to or, alternatively, serves as input 320, a noninverting input which is connected to or, alternatively, serves as input 322, and an output which is connected to or alternatively, serves as output 324. It should be noted that signal generator stage 310 may be referred to as a signal generator. Input 320 of signal generator stage 310 is connected to output 308 of input stage 302 and input 322 of signal generator stage 310 is coupled for receiving a reference voltage $V_{REF2}$. Suitable types of signals for reference signal $V_{REF2}$ include a sawtooth signal, a square wave signal, a sinusoidal signal, a Direct Current (DC) signal, etc. By way of example, comparator input signal $V_{REF2}$ is a sawtooth signal.

In accordance with an embodiment, switching network 312 is comprised of a plurality of switches and has an input 328 and outputs 58, 60, and 62. Input 328 is connected to output 324 of comparator 326. By way of example, switching network 312 is comprised of switches 50, 52, and 54, where switch 50 has a common conduction terminal that is connected to or, alternatively, serves as input 328, a conduction terminal that is connected to or, alternatively, serves as output 58, a conduction terminal that is commonly connected to conduction terminals of switches 52 and 54, and a control terminal coupled for receiving a control signal $V_{CTRC}$. Switch 52 has a common conduction terminal that is connected to or, alternatively, serves as an output 60, a conduction terminal coupled for receiving a source of operating potential such as operating potential $V_{DD}$, and a control terminal coupled for receiving a control signal $V_{CTRD}$. Switch 54 has a common conduction terminal that is connected to or, alternatively, serves as an output 62, a conduction terminal coupled for receiving a source of operating potential such as, for example, an operating potential $V_{SS}$, and a control terminal coupled for receiving a control signal $V_{CTRE}$. By way of example, $V_{SS}$ is ground potential and $V_{DD}$ is 3 volts. It should be noted that the values of operating potentials $V_{SS}$ and $V_{DD}$ are not limitations of the present invention. Switches 50, 52, and 54 may be single pole double throw switches, double pole, double throw switches, etc.

Output stage 18 has input terminals 80 and 82 and an output terminal 88, and is comprised of a plurality of transistors wherein each transistor has a control electrode and a pair of current carrying electrodes. As discussed above, for a field effect transistor the gate electrode serves as the control electrode and the source and drain electrodes serve as current carrying electrodes. In accordance with an embodiment, output stage 18 is comprised of transistors 92 and 94. By way of example, transistor 92 is a p-channel transistor and transistor 94 is an n-channel transistor. Transistor 92 has a gate electrode that may be connected to or, alternatively, serve as input 80, a source electrode coupled for receiving a source of operating potential $V_{DD1}$, and a drain electrode connected to a drain of n-channel transistor 94. In addition, transistor 94 has a gate electrode that may be connected to or, alternatively, serve as input 82 and a source electrode coupled for receiving a source of operating potential $V_{SS1}$.

Input terminals 80 and 82 are connected to outputs 60 and 62 through driver circuits or buffer circuits 102 and 104, respectively.

Output 58 of switch 50 is switchably or temporarily coupled to the inverting input of amplifier 318 through a series connected resistor 110 and switch 112, wherein a terminal of resistor 110 is connected to output 58 and the other terminal of resistor 110 is connected to a conduction terminal of switch 112. The other conduction terminal of switch 112 is connected to the inverting input of amplifier 318 and a control terminal of switch 112 is coupled for receiving a control signal $V_{CTRA}$.

Output 88 of output stage 18 is switchably coupled to the inverting input of amplifier 318 through a series connected resistor 120 and switch 122, wherein a terminal of resistor 120 is connected to output 88 and the other terminal of resistor 120 is connected to a conduction terminal of switch 122. The other conduction terminal of switch 122 is connected to the inverting input of amplifier 318 and a control terminal of switch 122 is coupled for receiving a control signal $V_{CTRB}$.

An active pull down stage 130 may be connected to output 88 of output stage 18. Active pull down stage 130 has been described with reference to FIG. 1.

In accordance with an embodiment audio amplification circuit 300 drives a load 148, which may be, for example, a speaker having a terminal connected to output 88 and a terminal coupled to, for example, source of operating potential $V_{SS1}$.

Figure 7:
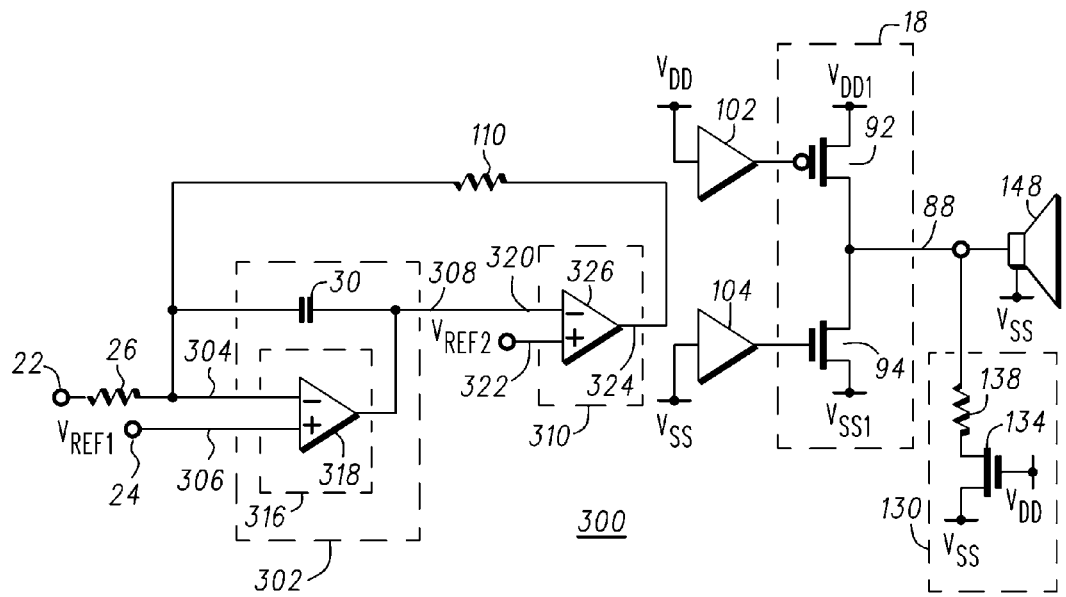
FIG. 7 is a schematic of the audio amplification circuit of FIG. 6 in accordance with an embodiment of the present invention, wherein switches of the audio amplification circuit are in a first configuration.

Briefly referring to FIG. 7, audio amplification circuit 300 is shown as being configured in an "off" operating mode. In the configuration shown in FIG. 7, output 88 is connected to operating potential $V_{SS1}$, the output of comparator 326 is connected to the inverting input of amplifier 318 through resistor 110 (and switch 112 which is not shown because it is closed), allowing a desired biasing of audio amplification circuit 300. Accordingly, output 88 is connected to operating potential $V_{SS1}$, precluding transients from being transmitted to speaker 148. In accordance with embodiments in which operating potential $V_{SS1}$ is ground, output 88 is tied to ground.

Figure 8:
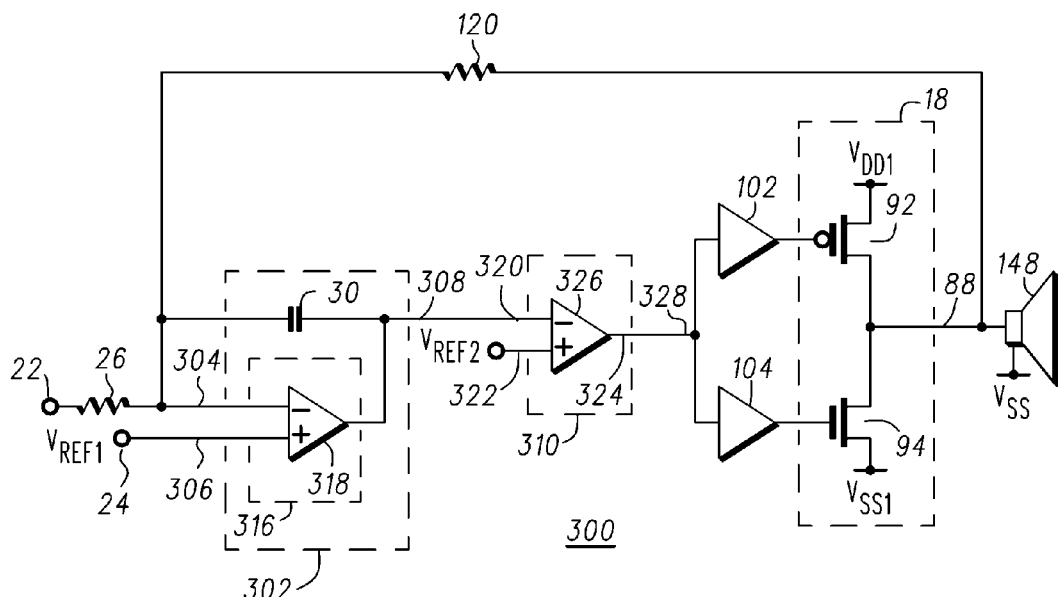
FIG. 8 is a schematic of the audio amplification circuit of FIG. 6 in accordance with an embodiment of the present invention, wherein switches of the audio amplification circuit are in a second configuration.

Briefly referring to FIG. 8, audio amplification circuit 300 is shown as being configured in an "on" operating mode. In the configuration shown in FIG. 8, output 88 is connected to speaker 148, the output of comparator 326 is connected to inputs 80 and 82 of output stage 18 through drivers 102 and 104, respectively. Output 88 is connected to inverting input 304 of operational amplifier 318 through resistor 120 and through switch 122 (which is not shown because it is closed).

Figure 9:
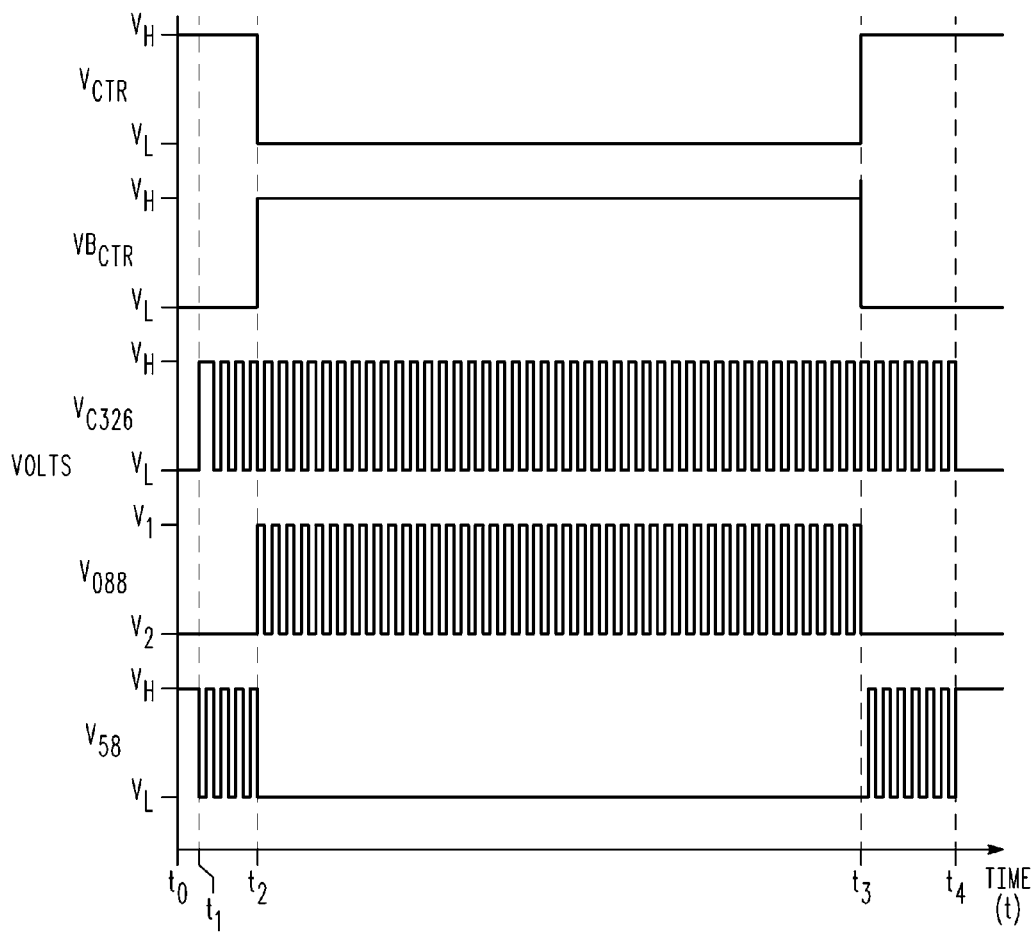
FIG. 9 is a timing diagram suitable for use with the audio amplification circuit of FIG. 6.

FIG. 9 is a timing diagram 350 of control signals appearing at the control terminals of switches 50, 52, 54, 112, 122, and 136 illustrated in FIG. 6. FIG. 9 also illustrates output signals $V_{C326}$ and $V_{O88}$ of signal generator stage 310 and output stage 18, respectively, and the feedback signal $V_{58}$ appearing at output 58. For the sake of universality, control signals $V_{CTRA}$, $V_{CTRC}$, $V_{CTRD}$, $V_{CTRE}$, and $V_{CTRF}$, are shown in FIG. 6 as being separate signals. However, in accordance with an embodiment, signals $V_{CTRA}$, $V_{CTRC}$, $V_{CTRD}$, $V_{CTRE}$, and $V_{CTRF}$ are the same signals and signal $V_{CTRB}$ is a complementary signal to signals $V_{CTRA}$, $V_{CTRC}$, $V_{CTRD}$, $V_{CTRE}$, and $V_{CTRF}$. Accordingly, signals $V_{CTRA}$, $V_{CTRC}$, $V_{CTRD}$, $V_{CTRE}$, and $V_{CTRF}$ in FIG. 9 are identified as control signal $V_{CTR}$ and signal $V_{CTRB}$ in FIG. 9 is identified as control signal $VB_{CTR}$. Signals $V_{CTR}$ and $VB_{CTR}$ may be referred to as enable and disable signals respectively. In operation, before time $t_0$ the system that includes audio amplification circuit 300 is off. In response to an enable signal at time $t_0$, audio amplification circuit 300 turns on and enters an idle mode in which amplifier 318 is on but its output is substantially grounded in embodiments in which operating voltage $V_{SS1}$ is at ground potential. In idle mode, the voltage levels of control signals $V_{CTR}$ and $VB_{CTR}$ are such that switch 112 is closed and switch 122 is open. By way of example, control signal $V_{CTR}$ is at a logic high voltage level and control signal $VB_{CTR}$ is at a logic low voltage level. Output 58 of switching network 312 is connected to the inverting input of amplifier 318 and output 88 of output stage 18 is electrically disconnected from the inverting input of amplifier 318. In addition, switch 50 is configured such that output 58 of switching network 312 is connected to the output of comparator 326.

Switches 52 and 136 are configured such that their common conduction terminals are coupled for receiving source of operating potential $V_{DD}$, and switch 54 is configured such that its common conduction terminal is coupled for receiving source of operating potential $V_{SS}$. As discussed with reference to FIG. 7, output 88 is substantially tied to voltage $V_{SS1}$ (which is at ground potential in embodiments in which voltage $V_{SS1}$ is at ground potential), the output of comparator 326 is connected to the inverting input of amplifier 318, allowing a desired biasing of audio amplification circuit 300. Output 88 is tied to voltage $V_{SS1}$, precluding transients from being transmitted to speaker 148.

In response to comparator input signal $V_{REF2}$ at the noninverting input of comparator 326 and output signal $V_{O1}$ from integrator circuit 302 and appearing at input 320 of comparator 326 at time $t_1$, comparator 326 generates an output signal $V_{C326}$ that is input to the common conduction terminal of switch 50. Because switch 50 is configured such that its common conduction terminal is electrically connected to output 58 and electrically disconnected from inputs 60 and 62, output signal $V_{C326}$ is transmitted to inverting input 304 of operational amplifier 318 through resistor 110 and switch 112 and output signal $V_{O88}$ is connected to potential $V_{SS1}$, which may be a ground potential.

At time $t_2$, control signal $V_{CTR}$ transitions to a logic low voltage level and control signal $VB_{CTR}$ transitions to a logic high voltage level, which closes switch 122 and opens switch 112 and ends the turn on sequence. In addition, control signal $V_{CTR}$ being at a logic low voltage level configures switch 50 such that output 58 of switching network 16 is disconnected from the inverting input of amplifier 318 and switches 50, 52, and 54 are configured such that their common conduction terminals are connected together, which connects the output of comparator 326 to the gate electrodes of transistors 92 and 94 through drivers 102 and 104, respectively. Output 88 of output stage 18 is electrically connected to the inverting input of amplifier 318 through resistor 120.

A brief delay occurs between times $t_1$ and $t_2$ during which circuit 300 is in an idle operating mode (idle mode) and the analog core is biased without any output transients.

Audio amplification circuit 300 enters a normal operating mode beginning at time $t_2$ during which output signal $V_{C326}$ may be a square wave and output signal $V_{O88}$ may be a square wave. Output signal $V_{O58}$ becomes substantially zero volts or it floats.

At time $t_3$, control signal $V_{CTR}$ transitions to a logic high voltage level and control signal $VB_{CTR}$ transitions to a logic low voltage level, which opens switch 122 and closes switch 112 and begins the turn off sequence. In addition, control signal $V_{CTR}$ being at a logic high voltage level configures switch 50 such that the common conduction terminal of switch 50 is connected to output 58 of switching network 312, which output 58 is connected to the inverting input of amplifier 318. Switches 52 and 54 are configured such that their common conduction terminals are coupled for receiving sources of operating potential $V_{DD}$ and $V_{SS}$, respectively. Because switch 50 is configured such that its common conduction terminal is electrically connected to output 58 and electrically disconnected from inputs 60 and 62, output signal $V_{C326}$ is transmitted to inverting input 304 of operational amplifier 318 through resistor 110 and switch 112 and output signal $V_{O88}$ is connected to potential $V_{SS1}$, which may be at ground potential.

At time $t_4$, circuit 300 enters an off mode or is disabled.

Figure 10:
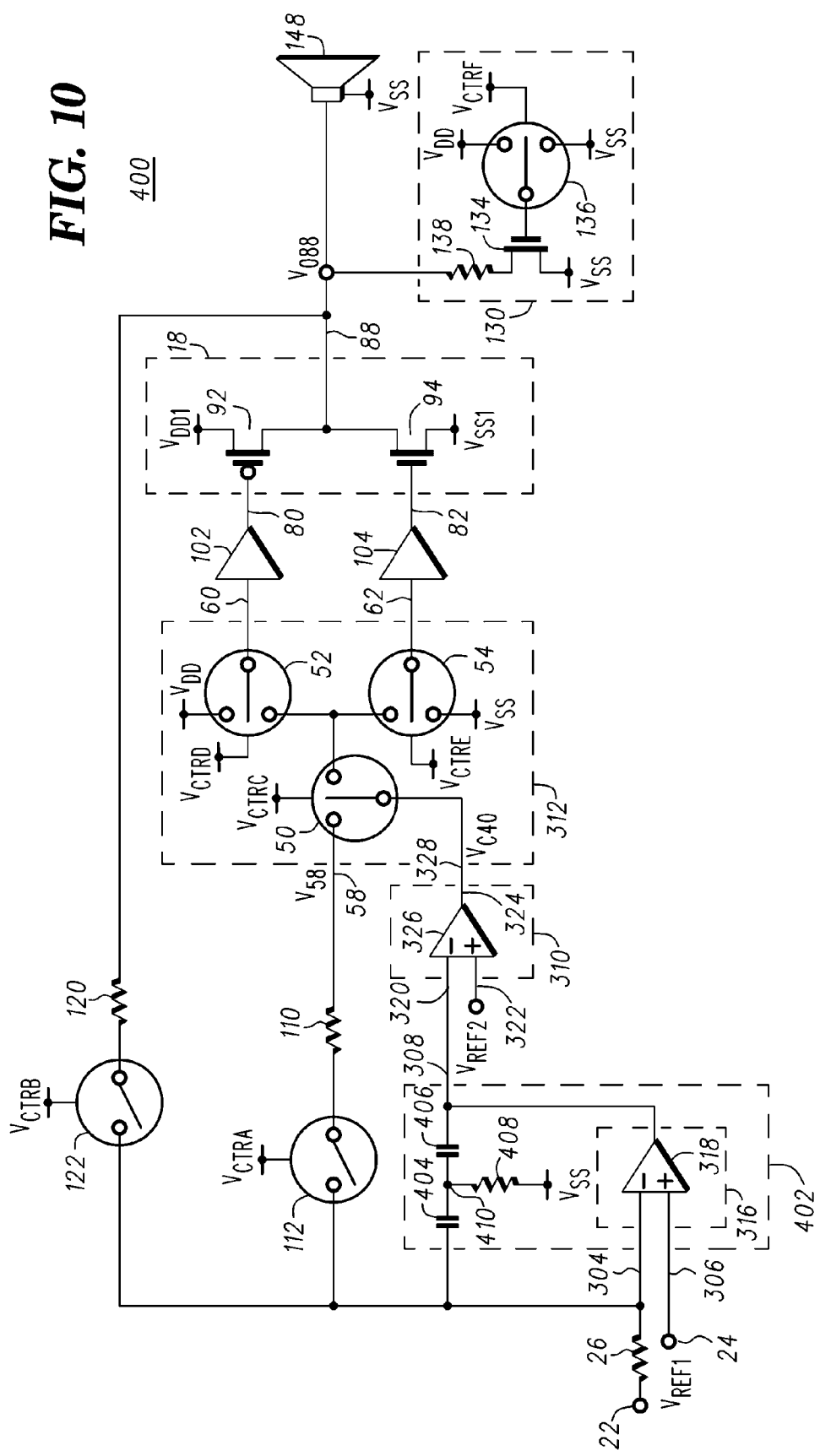
FIG. 10 is a schematic of an audio amplification circuit in accordance with another embodiment of the present invention.

FIG. 10 is a circuit schematic of an audio amplification circuit 400 in accordance with another embodiment of the present invention. Audio amplification circuit 400 includes an input stage 302 having inputs 304 and 306 and an output 308, a signal generator stage 310, a switching network 312, and an active pull down stage 130. In addition, audio amplification circuit 300 includes resistor 110 and switch 112 which provide a temporary feedback path and resistor 120 and switch 122 which provide a nominal feedback path. Output stage 18 and active pull down stage 130 have been described with reference to FIG. 1. It should be noted that control signal $V_{CTR11}$ (shown in FIG. 1) has been replaced by control signal $V_{CTRF}$ in active pull down stage 130 of FIG. 10. Switches 50, 52, and 54 of switching network 312 have been described with reference to FIG. 1.

Audio amplification circuit 400 differs from audio amplification circuit 300 in that input stage 302 is comprised of a first order integrator, whereas the input stage 402 of audio amplification circuit 400 comprises a second order integrator. Thus, capacitor 309 of input stage 302 is replaced by capacitors 404 and 406 and a resistor 408, where capacitors 404 and 406 each have a terminal commonly connected together to form a node 410 and resistor 408 is connected between node 410 and source of operating potential $V_{SS}$. Capacitor 404 has a terminal connected to the inverting input of operational amplifier 318 and capacitor 406 has a terminal connected to the output of operational amplifier 318.

By now it should be appreciated that an audio amplification circuit and a method for operating the audio amplification circuit have been provided. The audio amplification circuit includes switching circuitry that enables a feedback loop to temporarily connect the core of the audio amplification circuit to a biasing potential such as, for example, ground during start-up or wake-up operating modes thereby mitigating pop noise.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. An audio amplification circuit, comprising:
an input stage having a first input and a first output;
a signal generator stage having a first input and a first output, the first input of the signal generator stage coupled to the first output of the input stage;
a switching network comprising at least a first switch having a control terminal, a common conduction terminal, and first and second conduction terminals, the common conduction terminal coupled to the first output of the signal generator stage and the first conduction terminal switchably coupled to the first input of the input stage; and
an output stage having first and second inputs and a first output, the first input coupled to the second conduction terminal of the first switch.

2. The audio amplification circuit of claim 1, further including a feedback control switch coupled between the first conduction terminal of the first switch and the first input of the input stage.

3. The audio amplification circuit of claim 2, further including a first impedance coupled in series with the feedback control switch.

4. The audio amplification circuit of claim 1, wherein the input stage comprises an amplifier configured as an integrator and the signal generator stage comprises a first comparator having first and second inputs and an output, the first input coupled to the first output of the input stage and the second input configured to receive a first signal.

5. The audio amplification circuit of claim 1, wherein the input stage comprises:
an amplifier having first and second inputs and a first output, the first output serving as the output of the input stage; and
a first capacitor coupled between the first output and the first input of the amplifier.

6. The audio amplification circuit of claim 5, wherein the amplifier further includes a second output that serves as a second output of the input stage, and further including a second capacitor coupled between the second output and the second input of the amplifier.

7. The audio amplification circuit of claim 6, wherein the signal generator stage comprises:
a first comparator having first and second inputs and an output, the first input coupled to the first output of the amplifier and the second input configured to receive a first signal; and
a second comparator having first and second inputs and an output, the first input coupled to the second output of the amplifier and the second input coupled to the second input of the first comparator.

8. The audio amplification circuit of claim 7, wherein the switching network further comprises:
a second switch having a control terminal, a common conduction terminal, and first and second conduction terminals, the first conduction terminal of the second switch coupled to the second conduction terminal of the first switch; and
a third switch having a control terminal, a common conduction terminal, and first and second conduction terminals, the first conduction terminal of the third switch coupled to the first conduction terminal of the second switch and to the second conduction terminal of the first switch.

9. The audio amplification circuit of claim 1 further including an impedance switchably coupled between the output of the output stage and the first input of the input stage.

10. An audio amplification circuit, comprising:
an integrator having a first input, a second input, a first output, and a second output;
a signal generator having first, second, and third inputs, a first output, and a second output, the first input coupled to the first output of the integrator and the second input coupled to the second output of the integrator;
a switching network having first and second inputs and a plurality of outputs, the first input coupled to the first output of the signal generator, a first output switchably coupled to the first input of the integrator, the second input coupled to the second output of the signal generator, a second output switchably coupled to the second input of the integrator; and
an output stage having a plurality of inputs and first and second outputs, a first input of the output stage coupled to a third output of the switching network, a second input of the output stage coupled to a fourth output of the switching network, a third input of the output stage coupled to a fifth output of the switching network, and a fourth input of the output stage coupled to a sixth output of the switching network.

11. The audio amplification circuit of claim 10, further including:
a first feedback impedance switchably coupled between the first output of the output stage and the first input of the integrator; and
a second feedback impedance switchably coupled between the second output of the output stage and the second input of the integrator.

12. The audio amplification circuit of claim 10, wherein the switching network comprises:
a first switch having a control terminal, a common conduction terminal, and first and second conduction terminals, the common conduction terminal coupled to the first output of the signal generator and the first conduction terminal serving as the first output of the switching network;
a second switch having a control terminal, a common conduction terminal, and first and second conduction terminals, the common conduction terminal serving as a third output of the switching network, and the second conduction terminal coupled to the second conduction terminal of the first switch; and
a third switch having a control terminal, a common conduction terminal, and first and second conduction terminals, the common conduction terminal serving as a fourth output of the switching network, the second conduction terminal coupled to the second conduction terminals of the first and second switches.

13. The audio amplification circuit of claim 12, wherein the switching network further comprises:
a fourth switch having a control terminal, a common conduction terminal, and first and second conduction terminals, the common conduction terminal coupled to the second output of the signal generator and the first conduction terminal serving as the second output of the switching network;

a fifth switch having a control terminal, a common conduction terminal, and first and second conduction terminals, the common conduction terminal serving as a fifth output of the switching network, and the second conduction terminal coupled to the second conduction terminal of the fourth switch; and a sixth switch having a control terminal, a common conduction terminal, and first and second conduction terminals, the common conduction terminal serving as a sixth output of the switching network, the second conduction terminal coupled to the second conduction terminals of the fourth and fifth switches.

14. A method for inhibiting audible transients in an audio signal of an audio amplification circuit, comprising:

providing an input stage having an input and a first output;

providing a signal generator stage having a first input and a first output;

providing a switching network comprising at least a first switch having a control terminal, a common conduction terminal, and first and second conduction terminals, the common conduction terminal coupled to the first output of the signal generator stage and the common conduction terminal switchably coupled to the input of the input stage;

providing an output stage having first and second inputs and a first output, the first input switchably coupled to the second conduction terminal of the first switch; and coupling the first output of the first output stage to a first source of operating potential in response to one of starting the audio amplification circuit or turning off the audio amplification circuit.

15. The method of claim 14, wherein coupling the first output of the one or more outputs of the audio amplification circuit to the first source of operating potential includes disabling a first feedback path and enabling a second feedback path.

16. The method of claim 15, wherein disabling the first feedback path includes disabling a first feedback path that is between the first output of the one or more outputs of the audio amplification circuit and a first input of the one or more inputs of the audio amplification circuit.

17. The method of claim 16, wherein enabling the second feedback path includes coupling a node, that is between the first input and the first output, to the first input.

18. The method of claim 14, wherein coupling the first output of the first output stage to the first source of operating potential includes disabling a first feedback path and enabling a second feedback path, and wherein disabling the first feedback path includes configuring a second switch having a first conduction terminal and a second conduction terminal so that its first conduction terminal is decoupled from its second conduction terminal and from the input of the input stage.

19. The method of claim 14, wherein coupling the first output to the first source of operating potential includes disabling a first feedback path and enabling a second feedback path, and wherein enabling the second feedback path includes configuring a second switch having a first conduction terminal and a second conduction terminal so that its first conduction terminal is coupled to the input of the input stage.

* * * * *